(12) United States Patent
Kono et al.

(10) Patent No.: US 6,449,208 B1
(45) Date of Patent: Sep. 10, 2002

(54) SEMICONDUCTOR MEMORY DEVICE CAPABLE OF SWITCHING REFERENCE VOLTAGE FOR GENERATING INTERMEDIATE VOLTAGE

(75) Inventors: Takashi Kono; Yuichiro Komiya, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 71 days.

(21) Appl. No.: 09/923,454

(22) Filed: Aug. 8, 2001

(30) Foreign Application Priority Data

Feb. 5, 2001 (JP) ........................................ 2001-028397

(51) Int. Cl.[7] ................................................. G11C 7/00
(52) U.S. Cl. ................... 365/226; 365/189.09; 365/201
(58) Field of Search ................................ 365/201, 149, 365/189.09, 226

(56) References Cited

U.S. PATENT DOCUMENTS 5,051,995 A * 9/1991 Tobita ........................ 365/201
5,337,272 A * 8/1994 Suwa et al. .................. 365/149
5,973,981 A * 10/1999 Lee ............................. 365/201
6,222,781 B1 * 4/2001 Matsumoto et al. ..... 365/189.09

FOREIGN PATENT DOCUMENTS

JP 7-93977 4/1995 ......... G11C/11/413

* cited by examiner

Primary Examiner—Son Mai
(74) Attorney, Agent, or Firm—McDermott, Will & Emery

(57) ABSTRACT

A semiconductor memory device has a half Vdds generating circuit. The half Vdds generating circuit includes reference voltage generating circuits, a selecting circuit, and a driver circuit. In a normal mode, the driver circuit receives voltages Vnd1 and Vpd1 obtained by dividing an array operation voltage Vdds from the reference voltage generating circuit and outputs a precharge voltage Vb1 from an output node. In a test mode, the driver circuit receives voltages Vnd2 and Vpd2 obtained by dividing the voltage Vddp from the reference-voltage generating circuit, and outputs a precharge voltage Vb1 from the output node. As a result, a voltage as a reference used to generate an intermediate voltage can be switched between the normal mode and the test mode.

13 Claims, 9 Drawing Sheets

SEMICONDUCTOR MEMORY DEVICE CAPABLE OF SWITCHING REFERENCE VOLTAGE FOR GENERATING INTERMEDIATE VOLTAGE

BACKGROUND OF THE INVENTION

1. Field of the Invention

The present invention relates to a semiconductor memory device having therein a voltage generating circuit for generating an intermediate voltage by switching a power source voltage when a mode is switched.

2. Description of the Background Art

In a semiconductor memory device such as a DRAM (Dynamic Random Access Memory), a plurality of internal source voltages are generated from an external source voltage extVdd supplied from the outside and are used. For example, a voltage Vddp to be supplied to peripheral circuits including a row decoder and a column decoder, an array operation voltage Vdds to be supplied to a memory array including a plurality of memory cells arranged in a matrix, a boosted voltage Vpp to be supplied to a wordline WL, and the like are generated from the external source voltage extVdd.

In a general DRAM, a precharge voltage Vbl for precharging a bit line for reading out data from a memory cell is generated so as to be the half of the array operation voltage Vdds by referring to the array operation voltage Vdds. A cell plate voltage Vcp to be supplied to one of electrodes (cell plate electrode) of a capacitor as a component of a memory cell is also generated by referring to the array operation voltage Vdds so as to be the half of the array operation voltage Vdds.

FIG. 9 shows a conventional typical half Vdds generating circuit. Referring to FIG. 9, a half Vdds generating circuit 40D has a reference voltage generating circuit 42 and a driver circuit 44. The reference voltage generating circuit 42 has resistors 421 and 424, an N-channel MOS transistor 422, and a P-channel MOS transistor 423. The resistor 421 is connected between a power supply node 425 and a node 427. The N-channel MOS transistor 422 and the P-channel MOS transistor 423 are diode-connected in series between the node 427 and a node 428. The drain terminal of the N-channel MOS transistor 422 is connected to the node 427 and the drain terminal of the P-channel MOS transistor 423 is connected to the node 428.

The resistor 424 is connected between the node 428 and a ground node 426. The resistor 421 has a resistance value R1 and a resistor 424 has a resistance value R2.

The driver circuit 44 is constructed by an N-channel MOS transistor 441 and a P-channel MOS transistor 442. The N-channel MOS transistor 441 is connected between a power source node 443 and an output node 445, and the P-channel MOS transistor 442 is connected between the output node 445 and a ground node 444. The N-channel MOS transistor 441 receives a voltage on the node 427 in the reference voltage generating circuit 42 by its gate terminal. The P-channel MOS transistor 442 receives a voltage on the node 428 in the reference voltage generating circuit 42 by its gate terminal.

In the reference voltage generating circuit 42, the array operation voltage Vdds is supplied from the power supply node 425 and is divided to a voltage determined by a resistance value R1 of the resistor 421 and a voltage determined by a resistance value R2 of the resistor 424. The reference voltage generating circuit 42 outputs a voltage Vnd from the node 427, and outputs a voltage Vpd from the node 428. In this case, the voltages Vnd and Vpd are expressed by the following equations.

$$Vnd = Vn + Vthn1,\ Vpd = Vn - |Vthp1| \quad (1)$$

where, Vn denotes a voltage on a node 429, Vthn1 denotes a threshold voltage of the N-channel MOS transistor 422, and Vthp1 denotes a threshold voltage of the P-channel MOS transistor 423.

In the reference voltage generating circuit 42, when the size of the N-channel MOS transistor 422 and that of the P-channel MOS transistor 423 are set to be large with respect to a through current from the power supply node 425 to the ground node 426, a voltage Vn is expressed as the following equation.

$$Vn = |Vthp1| + (Vdds - Vthn1 - |Vthp1|) \times R2/(R1+R2) \quad (2)$$

The voltage Vnd on the node 427 and the voltage Vpd on the node 428 are supplied to the gate terminals of the N-channel MOS transistor 441 and the P-channel MOS transistor 442 in the driver circuit 44, respectively. In the case where a threshold voltage of the N-channel MOS transistor 441 and that of the P-channel MOS transistor 442 are set as Vthn2 and Vthp2, respectively, when Vbl−Vpd>|Vthp2|, the P-channel MOS transistor 442 is turned on, a current flows from the output node 445 to the ground node 444, and the precharge voltage Vbl decreases. When Vnd−Vbl>Vthn2, the N-channel MOS transistor 441 is turned on, a current flows from the power source node 443 to the output node 445, and the precharge voltage Vbl increases. The voltage level of the precharge voltage Vbl is therefore controlled by the voltages Vnd and Vpd supplied from the reference voltage generating circuit 42.

When Vthn1=Vthn2 and Vthp1=Vthp2 are satisfied, Vbl is equal to Vn from the equations (1) and (2), and the voltage level of the precharge voltage Vbl desired to be generated is determined by the resistance values R1 and R2. Particularly, when R1=R2 and Vthn1=Vthp1 are satisfied at the same time, Vbl=Vdds/2, that is, the precharge voltage Vbl is equal to just the half of the array operation voltage Vdds.

By determining as described above the resistance values R1 and R2 of the resistors 421 and 424 of the reference voltage generating circuit 42, the threshold voltages Vthn1 and Vthp1 of the N-channel MOS transistor 422 and the P-channel MOS transistor 423, and the threshold voltages Vthn2 and Vthp2 of the N-channel MOS transistor 441 and the P-channel MOS transistor 442 of the driver circuit 44, the half Vdds generating circuit 40D generates the precharge voltage Vbl and the cell plate voltage Vcp each of which is the half of the array operation voltage Vdds.

In a normal mode of the DRAM, each of the precharge voltage Vbl and the cell plate voltage Vcp is controlled to be the half of the array operation voltage Vdds. In the case where the array operation voltage fluctuates, the precharge voltage Vbl and the cell plate voltage Vcp accordingly fluctuate so as to follow the fluctuation in the array operation voltage Vdds.

In a test mode, however, when the precharge voltage Vbl and the cell plate voltage Vcp fluctuate with the array operation voltage Vdds, a problem such that an accurate test of a memory cell cannot be conducted occurs.

For example, in some tests, the array operation voltage Vdds is increased only by ΔVdds to carry out a margin test of memory cells. Referring to FIG. 10, the array operation voltage Vdds is increased only by ΔVdds at time T0 and is reset to a normal value at time T1. If the period from T0 to T1 is sufficiently long, the precharge voltage Vbl increases by ΔVdds/2.

Generally, a parasitic capacity of the precharge voltage Vbl is much larger than that of the array operation voltage Vdds. Consequently, even when the array operation voltage Vdds is reset to the normal value by time T2 at which an operation test of a memory cell is to be conducted, the precharge voltage Vbl is not yet reset to the normal value. The voltage of a pair of bit lines BL and /BL of a memory cell from which data is read is therefore higher than the precharge voltage Vbl. This influences a sense operation performed at the time of reading data from the memory cell. When it is assumed that H-level data is read from a memory cell to the bit line BL, a voltage difference between the bit lines, BL and /BL, becomes smaller than that in the normal mode. It makes difficult for a sense amplifier to amplify the voltage difference to the full level, Vdds and ground.

This problem occurs also in the case where the array operation voltage Vdds is made lower than a normal value for a predetermined period and, after that, data of an L (logic low) level is read from a memory cell.

There are also cases that only the precharge voltage Vbl is desired to be changed independently. However, in the conventional half Vdds generating circuit shown in FIG. 9, the precharge voltage Vbl follows the array voltage.

Consequently, in the case of supplying the precharge voltage Vbl of an arbitrary voltage level to a memory cell, a pad is prepared and the precharge voltage Vbl having an arbitrary voltage level is supplied by using a driver such as a tester from the outside.

However, in the case where a pad is disposed in a position quite different from the half Vdds generating circuit, resistance in a Vbl interconnection to the memory cell in the normal mode and that in the test mode are different from each other. When the precharge voltage Vbl is supplied from the pad, a problem such that an operation test of a memory cell adapted to an actual use state cannot be conducted occurs.

SUMMARY OF THE INVENTION

It is therefore an object of the invention to provide a semiconductor memory device having therein a voltage generating circuit capable of switching a voltage used as a reference to generate an intermediate voltage between a normal mode and a test mode.

According to the invention, there is provided a semiconductor memory device in which data is inputted/outputted to/from a plurality of memory cells included in a memory array, including: an external source terminal to which an external source voltage is inputted; a first voltage generating circuit for generating an internal source voltage on the basis of the external source voltage; and a second voltage generating circuit for generating an intermediate voltage as a voltage which is between the internal source voltage or reference voltage and a ground voltage and is necessary for inputting/outputting data to/from the plurality of memory cells, wherein the second voltage generating circuit generates the intermediate voltage in response to a voltage level of the internal source voltage in a normal mode, and generates the intermediate voltage in response to a voltage level of the reference voltage in a test mode.

In the semiconductor memory device according to the invention, the second voltage generating circuit generates the intermediate voltage by using a voltage which varies according to the normal mode and the test mode, and data is inputted/outputted to/from the plurality of memory cells. Therefore, according to the invention, the intermediate voltage following the internal source voltage in the normal mode can be controlled independently in the test mode.

Preferably, the second voltage generating circuit in the semiconductor memory device includes: a reference voltage generating circuit for generating a first reference voltage in response to a voltage level of the internal source voltage in the normal mode and generating a second reference voltage in response to a voltage level of the reference voltage in the test mode; and a driver circuit for outputting the intermediate voltage by supplying a current in response to a voltage level of the first or second reference voltage from a power source node.

By supplying a current from the power source node, the voltage level of the intermediate voltage can be held at a predetermined level. The current supplied from the source node is controlled by the first or second reference voltage. Therefore, according to the invention, the current supplied to generate the intermediate voltage can be controlled by the voltage. As a result, by supplying the voltage varying between the normal mode and the test mode to the circuit for generating an intermediate voltage, the intermediate voltage can be controlled independent of the internal source voltage.

Preferably, the semiconductor memory device further includes a control circuit for generating a first logic signal having a first logic level in the normal mode, and generating a second logic signal having a second logic level different from the first logic level in the test mode. The reference voltage generating circuit generates the first reference voltage in accordance with the first logic signal and generating the second reference voltage in accordance with the second logic signal.

In the normal mode, when the logic signal having the first logic level is received, the reference signal generating circuit generates the first reference voltage obtained by using the internal source voltage as a reference. In the test mode, when the logic signal having the second logic level is received, the reference voltage generating circuit generates the intermediate voltage obtained by using the reference voltage as a reference. Thus, according to the invention, the voltage as a reference to generate the intermediate voltage can be switched by the logic signal.

Preferably, the reference voltage generating circuit includes: a first node; a second node; a first voltage dividing circuit for dividing the internal source voltage to generate a first voltage and a second voltage; a second voltage dividing circuit for dividing the reference voltage to generate a third voltage and a fourth voltage; and a selecting circuit for outputting the first and second voltages to the first and second nodes, respectively, in response to the first logic signal and outputting the third and fourth voltages to the first and second nodes, respectively, in response to the second logic signal. The driver circuit includes: an output node; a first current supplying circuit for supplying a current from the power source node to the output node in response to a voltage level on the first node; and a second current supplying circuit for supplying a current from the output node to a ground node in response to a voltage level on the second node.

In the normal mode, the two voltages obtained by dividing the intermediate source voltage are supplied as first reference voltages to the driver circuit, and a current according to the voltage level of the two voltages is supplied from the source node. In the test mode, the two voltages obtained by dividing the reference voltage are supplied as second reference voltages to the driver circuit, and a current according to the voltage level of the two voltages is supplied from the source node. Therefore, according to the invention, a reference voltage can be easily generated.

Preferably, the first voltage dividing circuit includes: a third node corresponding to the first node; a fourth node corresponding to the second node; a first resistor connected between a power source node to which the internal source voltage is supplied and the third node; first and second MOS transistors of different conduction types diode-connected in series between the third and fourth nodes; and a second resistor connected between the fourth node and a ground node. The second voltage dividing circuit has: a fifth node corresponding to the first node; a sixth node corresponding to the second node; a third resistor connected between the power source node to which the internal source voltage is supplied and the fifth node; third and fourth MOS transistors of different conduction types diode-connected in series between the fifth and sixth nodes; and a fourth resistor connected between the sixth node and a ground node. The first current supplying circuit includes a fifth MOS transistor of a first conduction type for receiving a voltage on the first node by a gate terminal, and the second current supplying circuit includes a sixth MOS transistor of a second conduction type for receiving a voltage on the second node by a gate terminal.

Each of the reference voltage generating circuit and the driver circuit is constructed by using a resistor and a MOS transistor. Thus, the voltage generating circuit for generating a voltage which varies between the normal mode and the test mode can be fabricated by using the same devices as those of a memory cell.

Preferably, the semiconductor memory device further includes a control circuit for generating a first logic signal having a first logic level in the normal mode, and generating a second logic signal having a second logic level different from the first logic level in the test mode. The reference voltage generating circuit receives the internal source voltage supplied and generates the first reference voltage in accordance with the first logic signal, and receives the reference voltage supplied and generates the second reference voltage in accordance with the second logic signal.

In the normal mode, the internal source voltage is supplied, and the reference voltage generating circuit generates the first reference voltage on the basis of the supplied internal source voltage. In the test mode, the reference voltage is supplied, and the reference voltage generating circuit generates a second reference voltage on the basis of the reference voltage. The driver circuit outputs the intermediate voltage by supplying the current according to the first or second reference voltage from the source node. That is, the source voltage to be supplied to the reference voltage generating circuit can be switched between the normal mode and the test mode.

Therefore, according to the invention, intermediate voltages can be generated by using different voltages by a single reference voltage generating circuit.

Preferably, the reference voltage generating circuit includes: a voltage supplying circuit for supplying the internal source voltage in response to the first logic signal and supplying the reference voltage in response to the second logic signal; and a voltage dividing circuit for dividing the internal source voltage received from the voltage supplying circuit to generate the first reference voltage and dividing the reference voltage received from the voltage supplying circuit to generate the second reference voltage.

In the normal mode, the internal source voltage is divided to generate the first reference voltage. In the test mode, the reference voltage is divided to generate the second reference voltage. Therefore, according to the invention, by dividing the voltage which varies between the normal mode and the test mode, the intermediate voltages can be generated by using different voltages as a reference.

Preferably, the voltage supplying circuit includes: a first power source node to which the internal source voltage is supplied; a second power source node to which the reference voltage is supplied; a supply node for supplying the internal source voltage or the reference voltage; a first device for receiving the first logic signal and supplying the internal source voltage supplied to the first power source node to the supply node; and a second device for receiving the second logic signal and supplying the reference voltage supplied to the second power source node to the supply node. The voltage dividing circuit has: a first node; a second node; and a voltage dividing device for, when the first logic signal is received, dividing the internal source voltage to generate first and second voltages, and outputting the generated first and second voltages to the first and second nodes, respectively, when the second logic signal is received, dividing the reference voltage to generate third and fourth voltages, and outputting the generated third and fourth voltages to the first and second nodes, respectively. The driver circuit includes: an output node; a first current supplying device for supplying a current from the power source node to the output node in response to a voltage level on the first node; and a second current supplying device for supplying a current from the output node to a ground node in response to a voltage level on the second node.

The voltage which varies between the normal mode and the test mode is divided to generate two voltages, and the generated two voltages are supplied to the driver circuit. In the driver circuit, a current according to the voltage level of one of the supplied two voltages flows from the source node to the output node, and a current according to the voltage level of the other voltage flows from the output node to the ground node. Therefore, according to the invention, the intermediate voltage can be held constant by two voltages.

Preferably, the semiconductor memory device further includes a third voltage generating circuit for generating another internal source voltage on the basis of the external source voltage and supplying the generated another internal source voltage as the reference voltage to the second voltage generating circuit.

In each of the normal mode and the test mode, the intermediate voltage is outputted by using the internal source voltage generated on the inside as a reference. Therefore, according to the invention, the voltage used as a reference to generate the intermediate voltage can be switched on the inside.

Preferably, the second voltage generating circuit supplies the intermediate voltage to one of electrodes of a capacitor included in each of the plurality of memory cells.

The voltage supplied to one of the electrodes of the capacitor for holding information in a memory cell is switched between the normal mode and the test mode. Therefore, according to the invention, even when the voltage as a reference for generating the intermediate voltage fluctuates in the normal mode, the operation test on memory cells can be conducted with accuracy.

Preferably, the second voltage generating circuit supplies the intermediate voltage as a bit line pair precharging voltage for precharging a pair of bit lines provided in correspondence with the plurality of memory cells to the memory array.

The bit line pair precharging voltage for precharging a pair of bit lines is switched between the normal mode and the test mode. Therefore, according to the invention, even when the voltage as a reference to generate an intermediate voltage fluctuates in the normal mode, the operation of sensing data read from a memory cell can be conducted with accuracy.

Preferably, the semiconductor memory device further includes a reference voltage terminal to which the reference voltage is supplied.

In the test mode, the voltage used as a reference to generate an intermediate voltage is supplied from the outside. Therefore, according to the invention, the voltage level of the intermediate voltage to be generated in the test mode can be arbitrarily controlled.

Preferably, the prescribed voltage terminal receives in the normal mode a signal different in purpose from that of a signal received by the presecribed voltage termianl in the test mode.

By using the terminal for receiving a signal in the normal mode, the voltage used as a reference to generate the intermediate voltage is supplied in the test mode. Therefore, the semiconductor memory device capable of switching a voltage as a reference to generate the intermediate voltage can be fabricated without enlarging the chip size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
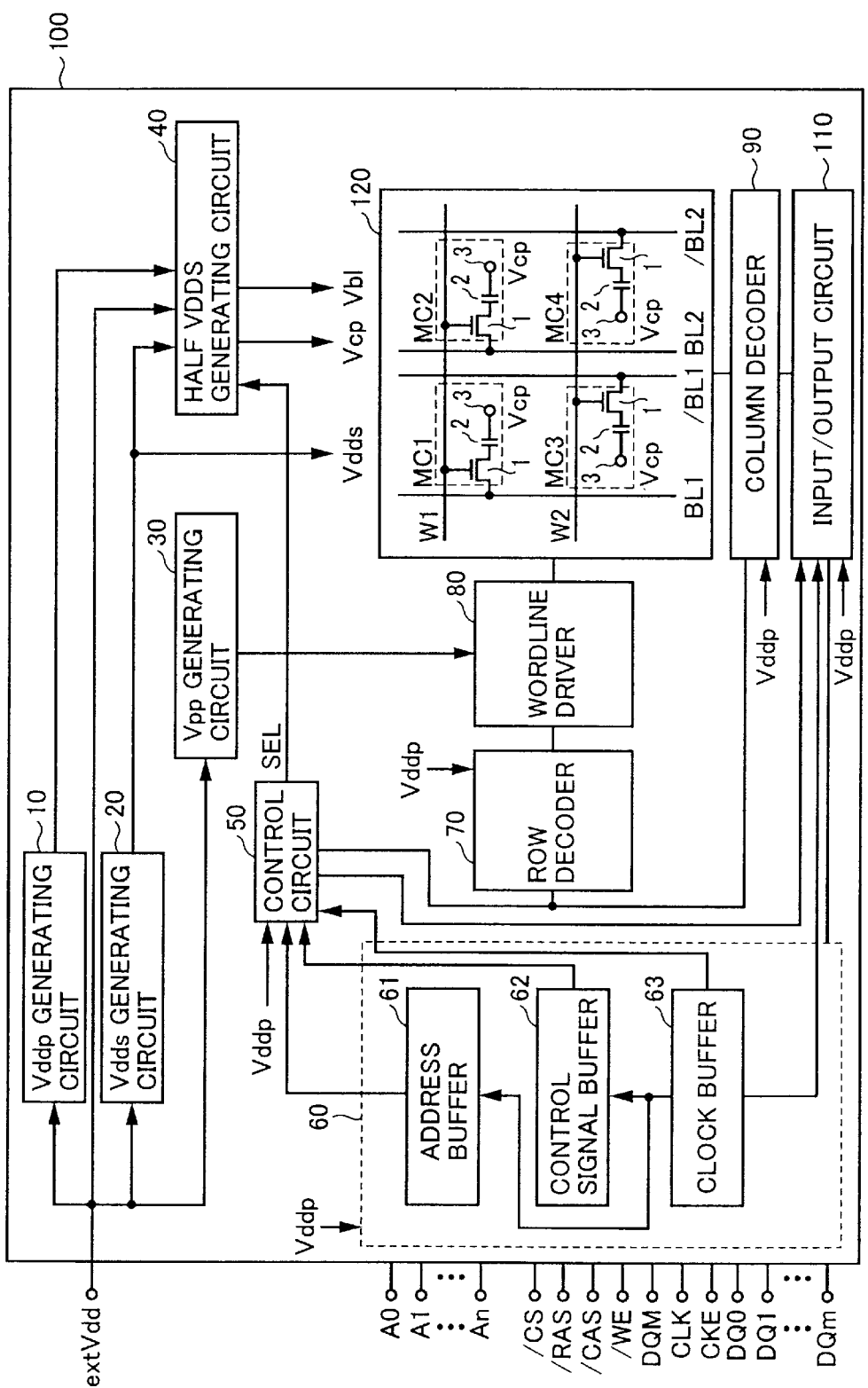
FIG. 1 is a schematic block diagram showing the configuration of a semiconductor memory device according to a first embodiment of the invention.

Embodiments of the invention will be described in detail hereinbelow with reference to the drawings. The same or corresponding parts are designated by the same reference numeral and their description will not be repeated.

First Embodiment

Referring to FIG. 1, a semiconductor memory device 100 according to a first embodiment of the invention includes a Vddp generating circuit 10, a Vdds generating circuit 20, a Vpp generating circuit 30, a half Vdds generating circuit 40, a control circuit 50, an input/output interface circuit 60, a row decoder 70, a wordline driver 80, a column decoder 90, an input/output circuit 110, and a memory array 120. The input/output interface circuit 60 includes an address buffer 61, a control signal buffer 62, and a clock buffer 63.

The Vddp generating circuit 10 generates a voltage Vddp obtained by decreasing an external source voltage extVdd supplied from an external terminal, and supplies the generated voltage Vddp to the half Vdds generating circuit 40, control circuit 50, input/output interface circuit 60, row decoder 70, column decoder 90, and input/output circuit 110. The Vdds generating circuit 20 generates an array operation voltage Vdds obtained by decreasing the external source voltage extVdd, and supplies the generated array operation voltage Vdds to the half Vdds generating circuit 40 and the memory array 120. The array operation voltage Vdds is used to be applied to a bit line BL or /BL when data is inputted/outputted to/from each of memory cells MC1 to MC4 included in the memory array 120.

The Vpp generating circuit 30 generates a boosted voltage Vpp higher than the external source voltage extVdd based on the external source voltage extVdd, and supplies the generated boosted voltage Vpp to the wordline driver 80. The half Vdds generating circuit 40 generates a precharge voltage Vbl and a cell plate voltage Vcp by a method described hereinlater and supplies the generated precharge voltage Vbl and cell plate voltage Vcp to the memory array 120. The precharge voltage Vbl is used to precharge a pair of bit lines BL1 and /BL1 and a pair of bit lines BL2 and /BL2. The cell plate voltage Vcp is supplied to one of electrodes of a capacitor of each of the memory cells MC1 to MC4.

The control circuit 50 is driven by the voltage Vddp from the Vddp generating circuit 10, and performs various controls synchronously with a clock signal CLK from the clock buffer 63 in the input/output interface circuit 60. The control circuit 50 performs, specifically, the following controls. In a normal mode, the control circuit 50 outputs a selection signal SEL with an H-level to the half Vdds generating circuit 40. In a test mode, the control circuit 50 outputs a selection signal SEL with an L level to the half Vdds generating circuit 40. The control circuit 50 receives the clock signal CLK and a clock enable signal CKE from the clock buffer 63 in the input/output interface circuit 60. When the clock enable signal CKE is at the H level at the rising edge of the clock signal CLK, the control circuit 50 regards that control signals (/CS, /RAS, /CAS, /WE, and DQM) supplied from the control signal buffer 62 are valid, and controls parts of the semiconductor memory device 100 on the basis of the control signals (/CS, /RAS, /CAS, /WE, and DQM). Further, when address signals A0 to An from the address buffer 61 are supplied synchronously with the row address strobe signal /RAS with the L level inputted from the control signal buffer 62 in the input/output interface circuit 60, the control circuit 50 outputs the address signals A0 to An as a row address to the row decoder 70. Further, when the address signals A0 to An from the address buffer 61 are supplied synchronously with the column address strobe signal /CAS with the L level inputted from the control signal buffer 62 in the input/output interface circuit 60, the control circuit 50 outputs the address signals A0 to An as a column address to the column decoder 90.

When the L-level row address strobe signal /RAS with the L level, the column address strobe signal /CAS with the L level, the write enable signal /WE with the L level, and address signals A0 to An in a predetermined pattern are received via the input/output interface circuit 60 before a memory cycle starts, the control circuit 50 recognizes that the semiconductor memory device 100 has been shifted to a test mode, and controls each of components in the test mode.

The input/output interface circuit 60 is driven by the voltage Vddp from the Vddp generating circuit 10. The address buffer 61 latches the address signals A0 to An from the external terminal synchronously with the clock signal CLK from the clock buffer 63, and outputs the latched address signals A0 to An to the control circuit 50. The control signal buffer 62 latches the chip select signal /CS, the row address strobe signal /RAS, the column address strobe signal /CAS, and the write enable signal /WE synchronously with the clock signal CLK from the clock buffer 63, and outputs the latched chip select signal /CS, row address strobe signal /RAS, column address strobe signal /CAS, and write enable signal /WE to the control circuit 50. The clock buffer 63 receives the clock signal CLK and the clock enable signal CKE, generates the internal clock signal with the predetermined delay and pulse width, outputs it to the address buffer 61, control signal buffer 62, control circuit 50, and input/output circuit 110, and outputs the clock enable signal CKE to the control circuit 50. The input/output interface circuit 60 outputs write data from the external terminals DQ0 to DQm to the input/output circuit 110, and outputs the read data from the input/output circuit 110 to the external terminals DQ0 to DQm.

The row decoder 70 is driven by the voltage Vddp from the Vddp generating circuit 10, decodes a row address received from the input/output interface circuit 60, and outputs the decoded row address to the wordline driver 80. The wordline driver 80 supplies the boosted voltage Vpp from the Vpp generating circuit 30 to a wordline W1 (or W2) designated by the row address from the row decoder 70 to allow the wordline W1 (or W2) designated by the row address to enter a driven state. The column decoder 90 is driven by the voltage Vddp from the Vddp generating circuit 10, decodes a column address from the input/output interface circuit 60, and selects the bit lines BL1 and /BL1 or BL2 and /BL2, which is designated by the column address decoded. The input/output circuit 110 is driven by the voltage Vddp from the Vddp generating circuit 10. The input/output circuit 110 sequentially writes data from the input/output interface circuit 60 to the bit lines BL1 and /BL1 or BL2 and /BL2 designated by the column decoder 90 synchronously with the clock signal CLK from the clock buffer 63, and sequentially outputs the data read from the bit lines BL1 and /BL1 or BL2 and /BL2 designated by the column decoder 90 to the input/output interface circuit 60. The input/output circuit 110 masks a part of the write data synchronously with the clock signal CLK on the basis of a data mask signal DQM from the control circuit 50.

The memory array 120 includes the memory cells MC1 to MC4, the wordlines W1 and W2, and the pairs of bit lines BL1 and /BL1 and BL2 and /BL2. Usually, the memory array includes n×m memory cells arranged in (n) rows and (m) columns. In FIG. 1, to make the explanation simpler, the memory cells MC1 to MC4 (arranged in two rows and two columns) are shown. Each of the memory cells MC1 to MC4 is comprised of the N-channel MOS transistor 1 and the capacitor 2. The cell plate voltage Vcp is supplied from the terminal 3 to the electrode (cell plate electrode) opposite to the electrode to which data is written in the capacitor 2.

Figure 2:
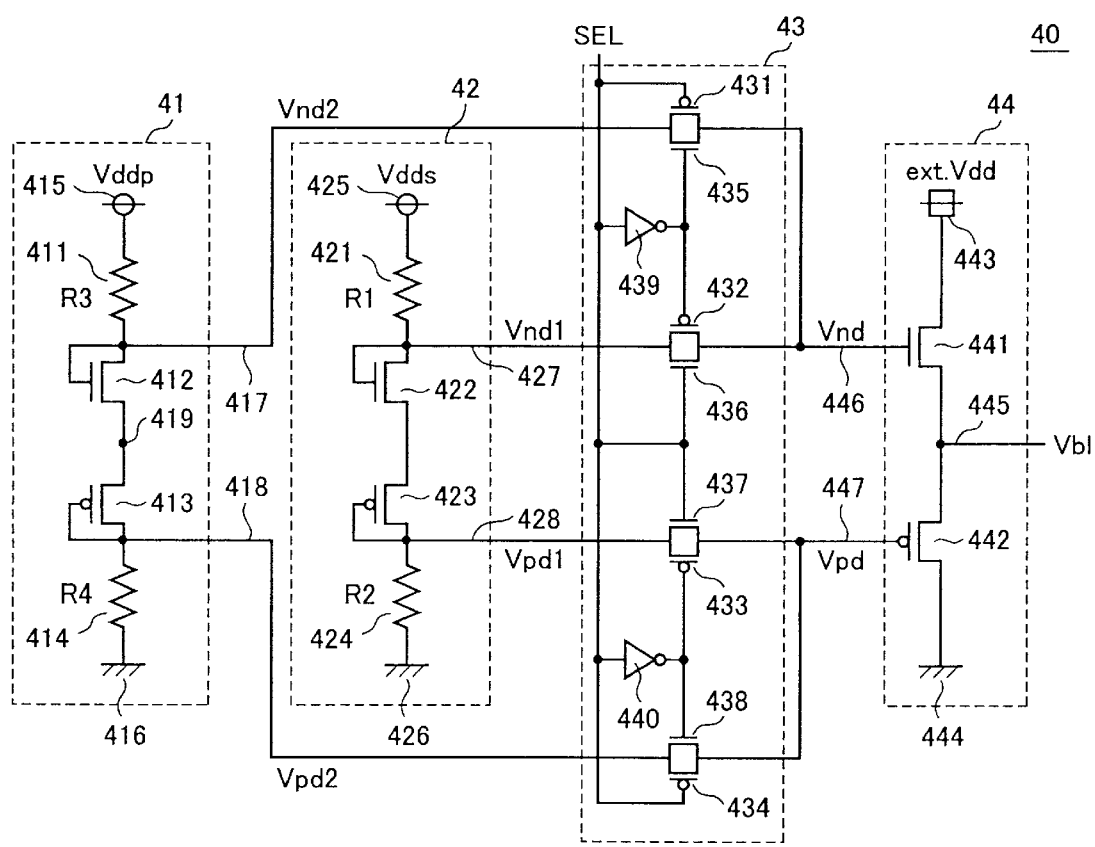
FIG. 2 is a circuit diagram of a half Vdds generating circuit in the semiconductor memory device shown in FIG. 1.
Figure 9:
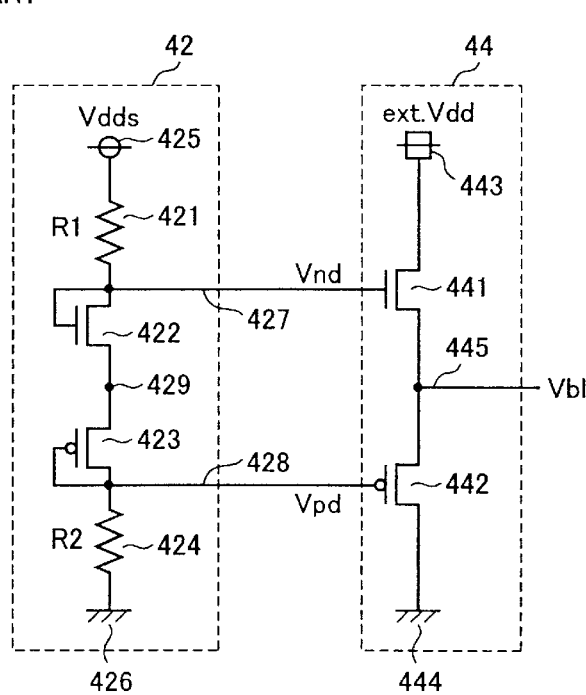
FIG. 9 is a circuit diagram of a conventional half Vdds generating circuit.

Referring to FIG. 2, the half Vdds generating circuit 40 includes the reference voltage generating circuits 41 and 42, selection circuit 43, and driver circuit 44. The reference voltage generating circuit 42 and the driver circuit 44 are as described above by referring to FIG. 9. The reference voltage generating circuit 41 includes resistors 411 and 414, an N-channel MOS transistor 412, and a P-channel MOS transistor 413. The resistor 411 is connected between a power source node 415 and a node 417. The N-channel MOS transistor 412 and the P-channel MOS transistor 413 are diode-connected in series between the node 417 and a node 418. In this case, the drain terminal of the N-channel MOS transistor 412 is connected to the node 417, and the drain terminal of the P-channel MOS transistor 413 is connected to the node 418. The resistor 414 is connected between the node 418 and a ground node 416. The resistor 411 has a resistance value R3, and the resistor 414 has a resistance value R4. The voltage Vddp from the Vddp generating circuit 10 is supplied to the power source node 415, and the reference voltage generating circuit 41 outputs the voltages Vnd2 and Vpd2 obtained by dividing the voltage Vddp from the nodes 417 and 418, respectively.

In this case, the voltages Vnd2 and Vpd2 are expressed by the following equations.

$$Vnd2 = Vn + Vthn3, \quad Vpd2 = Vn - |Vthp3| \qquad (3)$$

where Vn denotes a voltage on a node 419, Vthn3 denotes a threshold voltage of the N-channel MOS transistor 412, and Vthp3 denotes a threshold voltage of the P-channel MOS transistor 413.

In the reference voltage generating circuit 41, in the case where the size of the N-channel MOS transistor 412 and that of the P-channel MOS transistor 413 are set to be large with respect to a through current from the power source node 415 to the ground node 416, that is, in the case where the ON-state resistance of each of the N-channel MOS transistor 412 and the P-channel MOS transistor 413 when the through current flows is small, the voltage Vn is expressed by the following equation.

$$Vn = |Vthp3| + (Vddp - Vthn3 - |Vthp3|) \times R4/(R3+R4) \qquad (4)$$

The voltage Vnd2 on the node 417 and the voltage Vpd2 on the node 418 are supplied to the gate terminals of the N-channel MOS transistor 441 and the P-channel MOS transistor 442 in the driver circuit 44 via the selection circuit 43, respectively. The threshold voltage of the N-channel MOS transistor 441 is set as Vthn2, and that of the P-channel MOS transistor 442 is set as Vthp2. When Vbl−Vpd>|Vthp2|, the P-channel MOS transistor 442 is turned on, a current flows from the output node 445 to the ground node 444, and the precharge voltage Vbl decreases. When Vnd2−Vbl>Vthn2, the N-channel MOS transistor 441 is turned on, a current is supplied from the power source node 443 to the output node 445, and the precharge voltage Vbl rises. The voltage level of the precharge voltage Vbl is therefore controlled by the voltages Vnd2 and Vpd2 supplied from the reference voltage generating circuit 41.

When Vthn1=Vthn2=Vthn3 and Vthp1=Vthp2=Vthp3 are satisfied, from the equations (1) to (4), Vbl is equal to Vn. The voltage level of the precharge voltage Vbl desired to be generated is determined by the resistance values R1 and R2 or the resistance values R3 and R4. Particularly, when R1 is equal to R2, Vbl is equal to Vdds/2. When R3 is equal to R4, Vbl is equal to Vddp/2. The precharge voltage Vbl is just the half of the array operation voltage Vdds or just the half of the voltage Vddp.

The selecting circuit 43 includes P-channel MOS transistors 431 to 434, N-channel MOS transistors 435 to 438, and inverters 439 and 440. The P-channel MOS transistor 431 and the N-channel MOS transistor 435 are disposed between the node 417 of the reference voltage generating circuit 41 and a node 446 of the driver circuit 44. The P-channel MOS transistor 432 and the N-channel MOS transistor 436 are disposed between the node 427 of the reference voltage generating circuit 42 and the node 446 of the driver circuit 44. The P-channel MOS transistor 433 and the N-channel MOS transistor 437 are disposed between the node 428 of the reference voltage generating circuit 42 and a node 447 of the driver circuit 44. The P-channel MOS transistor 434 and the N-channel MOS transistor 438 are disposed between the node 418 of the reference voltage generating circuit 41 and the node 447 of the driver circuit 44. The inverters 439 and 440 invert the logic level of the selection signal SEL from the control circuit 50 and output the resultant signal. The P-channel MOS transistors 431, and 434 and the N-channel MOS transistors 436 and 437 receive the selection signal SEL from the control circuit 50 by their gate terminals, the P-channel MOS transistor 432 and the N-channel MOS transistor 435 receive a selection signal /SEL inverted by the inverter 439 by their gate terminals, and the P-channel MOS transistor 433 and the N-channel MOS transistor 438 receive the selection signal /SEL inverted by the inverter 440 by their gate terminals.

Consequently, when the selection signal SEL is at the H level, the P-channel MOS transistors 431 and 434 and the N-channel MOS transistors 435 and 438 are turned off, and the P-channel MOS transistors 432 and 433 and the N-channel MOS transistors 436 and 437 are turned on. The voltages Vnd1 and Vpd1 on the nodes 427 and 428 of the reference voltage generating circuit 42 are therefore supplied to the nodes 446 and 447, respectively. Specifically, when the selection signal SEL is at the H level, the driver circuit 44 supplies a current controlled by the voltages Vnd1 and Vpd1 from the reference voltage generating circuit 42 and outputs the precharge voltage Vbl to the output node 445.

When the selection signal SEL is at the L level, the P-channel MOS transistors 431 and 434 and the N-channel MOS transistors 435 and 438 are turned on, the P-channel MOS transistors 432 and 433 and the N-channel MOS transistors 436 and 437 are turned off. Consequently, the voltages Vnd2 and Vpd2 on the nodes 417 and 418 of the reference voltage generating circuit 41 are supplied to the nodes 446 and 447, respectively. Specifically, when the selection signal SEL is at the L level, the driver circuit 44 supplies a current controlled by the voltages Vnd2 and Vpd2 from the reference voltage generating circuit 41 from the power supply node 443, and outputs the precharge voltage Vbl to the output node 445.

In a normal mode, therefore, the half Vdds generating circuit 40 receives the H-level selection signal SEL with the H level from the control circuit 50 and outputs the precharge voltage Vbl controlled by the voltages Vnd1 and Vpd1 from the reference voltage generating circuit 42. In the test mode, the half Vdds generating circuit 40 receives the selection signal SEL with the H level from the control circuit 50 and outputs the precharge voltage Vbl controlled by the voltages Vnd2 and Vpd2 from the reference voltage generating circuit 41. That is, the half Vdds generating circuit 40 outputs the precharge voltage Vbl by using a voltage which varies according to the modes as a reference.

The half Vdds generating circuit 40 supplies the voltage on the output node 445 as a precharge voltage Vbl or cell plate voltage Vcp to the memory array 120. Consequently, the precharge voltage Vbl and the cell plate voltage Vcp using different voltages as a reference in accordance with the normal mode and the test mode can be supplied to the memory array 120.

Referring again to FIG. 1, a data writing/reading operation in the semiconductor memory device 100 will be described. First, the operation of writing/reading data in the normal mode will be described. When the external source voltage extVdd is supplied from the power source terminal, the Vddp generating circuit 10 drops the external source voltage extVdd to generate the voltage Vddp, and supplies the generated voltage Vddp to the half Vdds generating circuit 40, control circuit 50, input/output interface circuit 60, row decoder 70, column decoder 90, and input/output circuit 110. The Vdds generating circuit 20 generates the array operation voltage Vdds by dropping the external source voltage extVdd, and supplies the generated array operation voltage Vdds to the half Vdds generating circuit 40 and the memory array 120. The Vpp generating circuit 30 boosts the external source voltage extVdd to generate the boosted voltage Vpp, and supplies the generated boosted voltage Vpp to the wordline driver 80. The half Vdds generating circuit 40 receives the selection signal SEL with the H level from the control circuit 50, generates the precharge voltage Vbl and cell plate voltage Vcp each of which is equal to the half (Vdds/2) of the array operation voltage Vdds as described above, and supplies the generated precharge voltage Vbl and cell plate voltage Vcp to the memory array 120. In such a manner, the cell plate voltage Vcp is supplied from the terminal 3 to the cell plate of the capacitor 2 in each of the memory cells MC1 to MC4.

In a standby mode, the row address strobe signal /RAS is in an H-level inactive state. In this state, both the wordlines W1 and W2 are at the L level, and the N-channel MOS transistor 1 in each of the memory cells MC1 to MC4 is in an OFF state. The pairs of bit lines BL1, /BL1 and BL2 and /BL2 are equalized by an equalizing circuit (not shown), and are precharged by the precharge voltage Vbl supplied from the half Vdds generating circuit 40.

When the chip select signal /CS with the L level is received from the control signal buffer 62, the control circuit 50 recognizes that the semiconductor memory device 100 is selected. When the row address strobe signal /RAS with the L level is received from the control signal buffer 62, the control circuit 50 starts the memory cycle. In this state, the operation of equalizing the pairs of bit lines BL1 and /BL1, and BL2 and /BL2 by the equalizing circuit has been finished. The pairs of bit lines BL1 and /BL1 and BL2 and /BL2 are in a floated state of the precharge voltage Vbl. When the address signals A0 to An are inputted in response to the trailing edge of the row address strobe signal /RAS, the control circuit 50 outputs the received address signals A0 to An to the row decoder 70. The row decoder 70 decodes the input row address and outputs the decoded row address to the wordline driver 80. The wordline driver 80 selects the wordline W1 or W2 designed by the input row address, and supplies the boosted voltage Vpp supplied from the Vpp generating circuit 30 to make the wordline W1 or W2 active. Assuming now that the wordline W1 is made active, the N-channel MOS transistor 1 in each of the memory cells MC1 and MC2 is turned on, and information stored in the capacitor 2 is transmitted to the bit lines BL1 and BL2. The bit lines /BL1 and /BL2 maintain the precharge voltage Vbl, and the difference between the potentials of the bit lines BL1 and /BL1 or the bit lines BL2 and /BL2 is amplified by a sense amplifier (not shown).

After that, when the address signals A0 to An are supplied in response to the trailing edge of the column address strobe signal /CAS, the control circuit 50 outputs the input address signals A0 to An to the column decoder 90. The column decoder 90 decodes the input column address. By the decoded column address, a column selecting operation of selecting the pair of bit lines BL1 and /BL1 or the pair of bit lines BL2 and /BL2 is performed. An operation of writing/reading data to/from the memory cell (MC1) on the selected column is executed. In this case, the data writing operation is performed in such a manner that the input/output circuit 110 which has received the data supplied from the input/output terminals DQ0 to DQm via the input/output interface circuit 60 supplies a voltage corresponding to data to a bit line selected by the column selecting operation synchronously with the clock signal CLK. The data reading operation is performed as follows. A potential difference between the bit lines BL1 and /BL1 amplified by a sensing operation is transmitted to a pair of input/output lines IO and /IO (not shown) by a column selecting operation, the input/output circuit 110 receives the difference between potentials on the pair of input/output lines IO and /IO, and data corresponding to the potential difference is outputted to the input/output terminals DQ0 to DQm via the input/output interface circuit 60.

When the data writing/reading operation is completed and the row precharge operation is designated, the row address strobe signal/RAS is made inactive, a signal potential on the selected wordline W1 goes low. The sense amplifier is made inactive, and the pair of bit lines BL1 and /BL1 and the pair of bit lines BL2 and /BL2 are equalized by the equalizing circuit, and are precharged by the precharge voltage Vbl.

By repeating the above-described cycle, data is written/read to/from the memory cells MC1 to MC4.

The data writing/reading operation in a test mode will now be described. The operations of receiving the external source voltage extVdd supplied from the power source terminal, and generating the voltage Vddp, array operation voltage Vdds, boosted voltage Vpp, precharge voltage Vbl, and cell plate voltage Vcp by the Vddp generating circuit 10, Vdds generating circuit 20, Vpp generating circuit 30, and half Vdds generating circuit 40 are the same as those in the normal mode. Before starting an access to a memory cell, control signals (/RAS, /CAS, /WE) of a predetermined pattern and address signals (AO to An) are inputted. The control circuit 50 recognizes that the mode has been shifted to a test mode, and outputs the selection signal SEL with the L level to the half Vdds generating circuit 40. The half Vdds generating circuit 40 generates the precharge voltage Vbl and the cell plate voltage Vcp controlled by the voltages Vnd2 and Vpd2 from the reference voltage generating circuit 41 in response to the selection signal SEL with the L level, and supplies the generated precharge voltage Vbl and cell plate voltage Vcp to the memory array 120. By the operation, the precharge voltage Vbl and cell plate voltage Vcp generated by using, as a reference, the voltage Vddp from the Vddp generating circuit 10 are supplied to the memory array 120. After that, an operation test is conducted on the memory cells MC1 to MC4 by writing/reading data to/from the memory cells MC1 to MC4 by the same operation as that in the normal mode, and determining whether read data coincides with written data or not.

Figure 10:
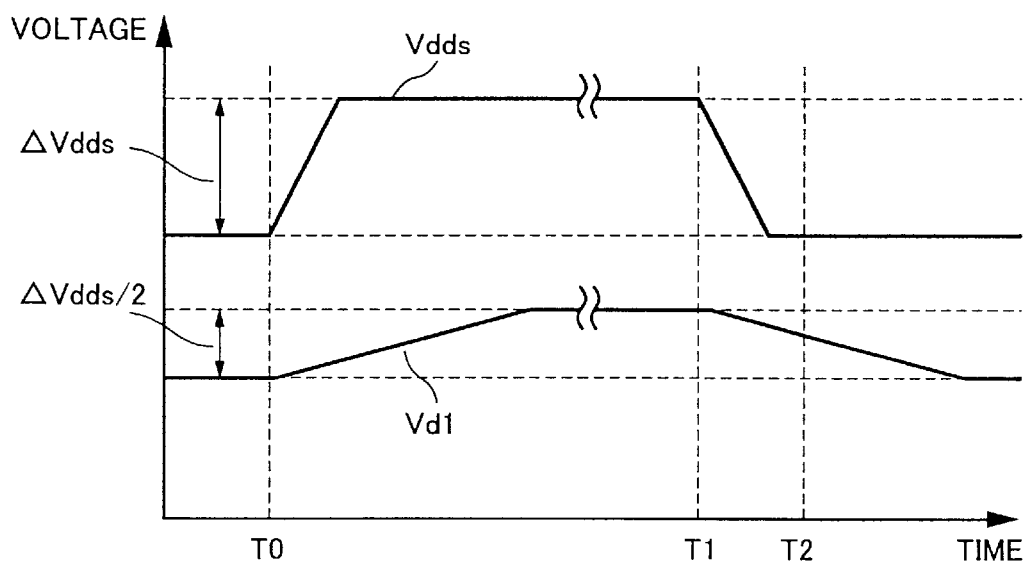
FIG. 10 is a timing chart of the array operation voltage and the precharge voltage.

As described above, in the test mode, the half Vdds generating circuit 40 generates the precharge voltage Vbl and cell plate voltage Vcp by using, as a reference, the voltage Vddp different from the array operation voltage Vdds, and supplies the generated precharge voltage Vbl and cell plate voltage Vcp to the memory array 120. Even when a regular operation test is conducted after increasing or decreasing the array operation voltage Vdds only by ΔVdds for a predetermined period as shown in FIG. 10 for a margin test of the array operation voltage Vdds, the precharge voltage Vbl does not follow the array operation voltage Vdds and fluctuate. Consequently, no influence is exerted on the sensing operation at the time of reading data.

Figure 3:
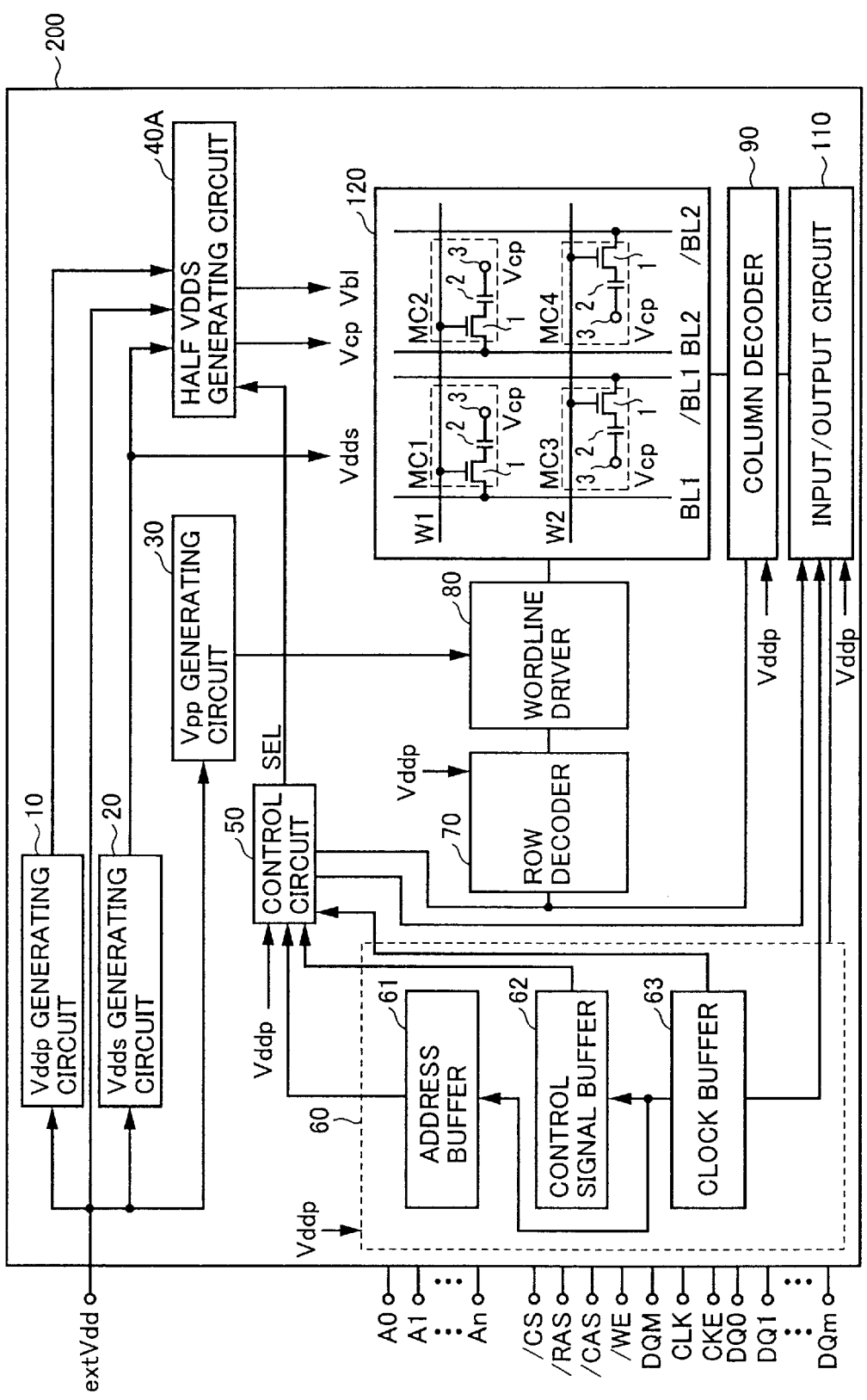
FIG. 3 is a schematic block diagram showing another configuration of the semiconductor memory device in the first embodiment.

As the semiconductor memory device according to the first embodiment, a semiconductor memory device 200 shown in FIG. 3 may be used. The semiconductor memory device 200 is similar to the semiconductor memory device 100 shown in FIG. 1 except that the half Vdds generating circuit 40 is replaced by a half Vdds generating circuit 40A. The half Vdds generating circuit 40A generates the precharge voltage Vbl and cell plate voltage Vcp on the basis of the voltage Vddp from the Vddp generating circuit 10, external source voltage extVdd, and array operation voltage Vdds from the Vdds generating circuit 20 by a method described hereinlater, and supplies the generated precharge voltage Vbl and cell plate voltage Vcp to the memory array 120.

Figure 4:
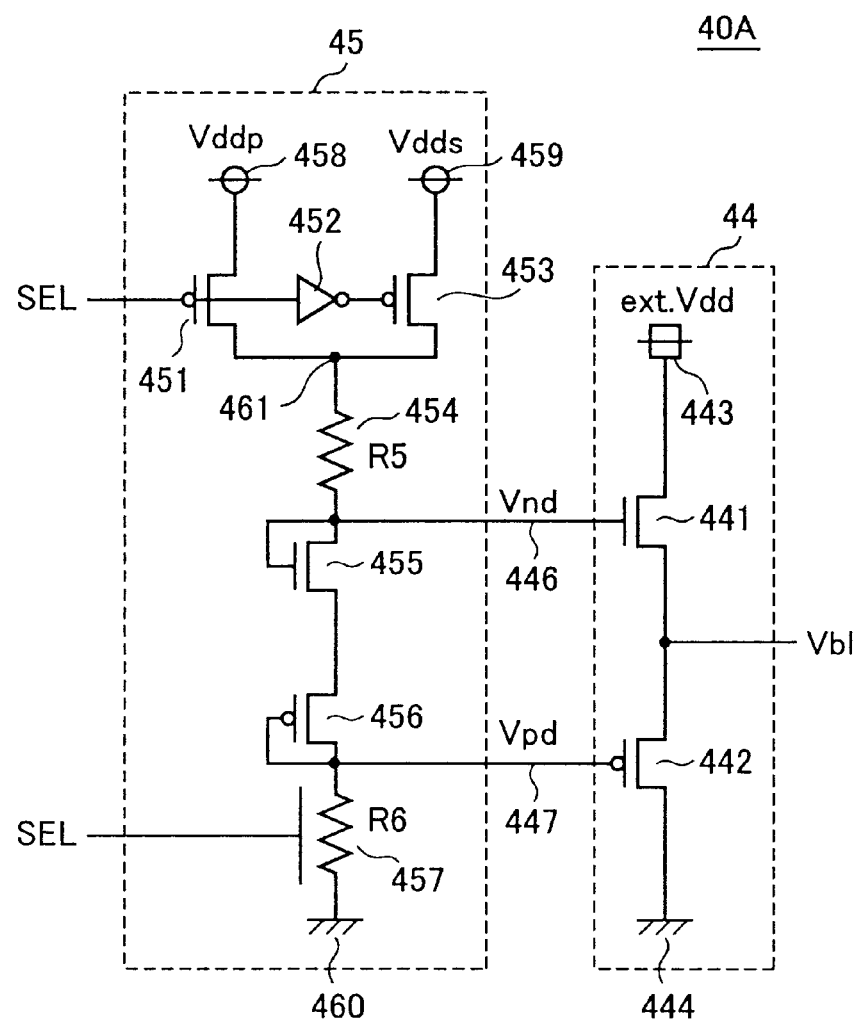
FIG. 4 is a circuit diagram of a half Vdds generating circuit of the semiconductor memory device shown in FIG. 3.

Referring to FIG. 4, the half Vdds generating circuit 40A has a reference voltage generating circuit 45 and the driver circuit 44. The driver circuit 44 is as described by referring to FIG. 9.

The reference voltage generating circuit 45 includes P-channel MOS transistors 451, 453, and 456, an N-channel MOS transistor 455, an inverter 452, and resistors 454 and 457. The P-channel MOS transistor 451 is connected between the power source node 458 and the node 461, and the P-channel MOS transistor 453 is connected between the power source node 459 and the node 461. The gate terminal of the P-channel MOS transistor 451 and the gate terminal of the P-channel MOS transistor 453 are connected to each other via the inverter 452. The P-channel MOS transistor 451 receives the selection signal SEL from the control circuit 50 by its gate terminal. The P-channel MOS transistor 453 receives the signal /SEL obtained by inverting the selection signal SEL from the control circuit 50 by its gate terminal.

The resistor 454 is connected between the nodes 461 and 446. The N-channel MOS transistor 455 and the P-channel MOS transistor 456 are diode-connected in series between the nodes 446 and 447. In this case, the drain terminal of the N-channel MOS transistor 455 is connected to the node 446, and the drain terminal of the P-channel MOS transistor 456 is connected to the node 447. The resistor 457 is connected between the node 447 and the ground node 460. The resistor 454 has a fixed resistance value R5, and the resistor 457 has a variable resistance value R6. The resistance value R6 of the resistor 457 changes according to the selection signal SEL from the control circuit 50. Specifically, when the selection signal SEL with the H level is inputted from the control circuit 50, the resistance value of the resistor 457 is set so that the precharge voltage Vbl becomes equal to the half of the array operation voltage Vdds. When the selection signal SEL with the L level is supplied from the control circuit 50, the resistance value of the resistor 457 is set so that the precharge voltage Vbl obtained by using the voltage Vddp as a reference becomes at the same voltage level as in the case where the array operation voltage Vdds is used as a reference.

The voltage Vddp from the Vddp generating circuit 10 is supplied to the power source node 458, and the array operation voltage Vdds from the Vdds generating circuit 20 is supplied to the power source node 459. Consequently, when the selection signal SEL with the H level is received, the reference voltage generating circuit 45 generates the voltages Vnd and Vpd obtained by dividing the array operation voltage Vdds, and the generated voltages Vnd and Vpd are supplied to the gate terminals of the N-channel MOS transistor 441 and the P-channel MOS transistor 442, respectively, in the driver circuit 44. When the selection signal SEL with the L level is received, the reference voltage generating circuit 45 generates the voltages Vnd and Vpd obtained by dividing the voltage Vddp, and supplies the generated voltages Vnd and Vpd to the gate terminals of the N-channel MOS transistor 441 and the P-channel MOS transistor 442, respectively, in the driver circuit 44. In the reference voltage generating circuit 45, therefore, the array operation voltage Vdds or the voltage Vddp is supplied according to the selection signal SEL from the control circuit 50, and the voltages Vnd and Vpd obtained by dividing the supplied array operation voltage Vdds or the voltage Vddp are supplied to the driver circuit 44. By changing the resistance value R6 of the resistor 457 by the selection signal SEL, the resistance ratio R5/R6 of the resistances R5 and R6 is adjusted, and the voltage level of each of the precharge voltage Vbl and the cell plate voltage Vcp generated by using the array operation voltage Vdds as a reference and the voltage level of each of the precharge voltage Vbl and the cell plate voltage Vcp generated by using the voltage Vddp as a reference can be equalized.

The driver circuit 44 outputs the precharge voltage Vbl and the cell plate voltage Vcp obtained by using either the array operation voltage Vdds or the voltage Vddp as a reference. The P-channel MOS transistors 451 and 453, inverter 452, and power source nodes 458 and 459 construct a "voltage supplying circuit".

As described above, in the normal mode, the half Vdds generating circuit 40A supplies the precharge voltage Vbl and the cell plate voltage Vcp obtained by using the array operation voltage Vdds as a reference to the memory array 120. In the test mode, the half Vdds generating circuit 40A supplies the precharge voltage Vbl and the cell plate voltage Vcp obtained by using the voltage Vddp as a reference to the memory array 120. Consequently, the semiconductor memory device 200 can accurately conduct an operation test in the test mode in a manner similar to the semiconductor memory device 100.

The data writing/reading operation in the semiconductor memory device 200 is performed in a manner similar to the above.

In the above description, in the semiconductor memory devices 100 and 200, each of the half Vdds generating circuits 40 and 40A generates the precharge voltage Vbl and the cell plate voltage Vcp obtained by using the voltage Vddp as a reference in the test mode. The invention is not limited to the above but each of the half Vdds generating circuits 40 and 40A may generate the precharge voltage Vbl and the cell plate voltage Vcp obtained by using the boosted voltage Vpp applied to the wordlines W1 and W2 as a reference.

In the above description, each of the half Vdds generating circuits 40 and 40A generates the precharge voltage Vbl and the cell plate voltage Vcp by using the array operation voltage Vdds or the voltage Vddp as a reference. The invention is not limited to the above but each of the half Vdds generating circuits 40 and 40A may generate either the precharge voltage Vbl or the cell plate voltage Vcp by using the array operation voltage Vdds or the voltage Vddp as a reference.

Although it has been described above that the number of voltages to be referred to other than the array operation voltage Vdds is one in each of the half Vdds generating circuits 40 and 40A, the invention is not limited to the number. The number of voltages to be referred to other than the array operation voltage Vdds may be two or more. In this case, in the half Vdds generating circuit 40, reference voltage generating circuits each having the same configuration as that of the reference voltage generating circuit 41 are added in correspondence with the number of voltages to be referred to other than the array operation voltage Vdds. Voltages from the reference voltage generating circuits are selectively supplied to the nodes 446 and 447 by the selecting circuit 43. In the half Vdds generating circuit 40A, a power source node and a P-channel MOS transistor similar to the power source node 458 and the P-channel MOS transistor 451, respectively, are added in correspondence with the number of voltages to be referred to other than the array operation voltage Vdds. Each of the plurality of voltages is selectively supplied to the node 419 in accordance with the selection signal SEL from the control circuit 50.

According to the first embodiment, the semiconductor memory device has therein the half Vdds generating circuit for supplying the precharge voltage and the cell plate voltage obtained by using the array operation voltage as a reference to the memory array in the normal mode, and supplying the precharge voltage and the cell plate voltage obtained by using the voltage different from the array operation voltage as a reference to the memory array in the test mode. Consequently, even when a normal operation test is conducted after fluctuating the array operation voltage for a predetermined period to conduct a margin test of the array operation voltage, the operation of writing/reading data to/from a memory cell can be performed with accuracy. In the test mode, the array operation voltage can be controlled independent of the precharge voltage or the cell plate voltage.

Second Embodiment

Figure 5:
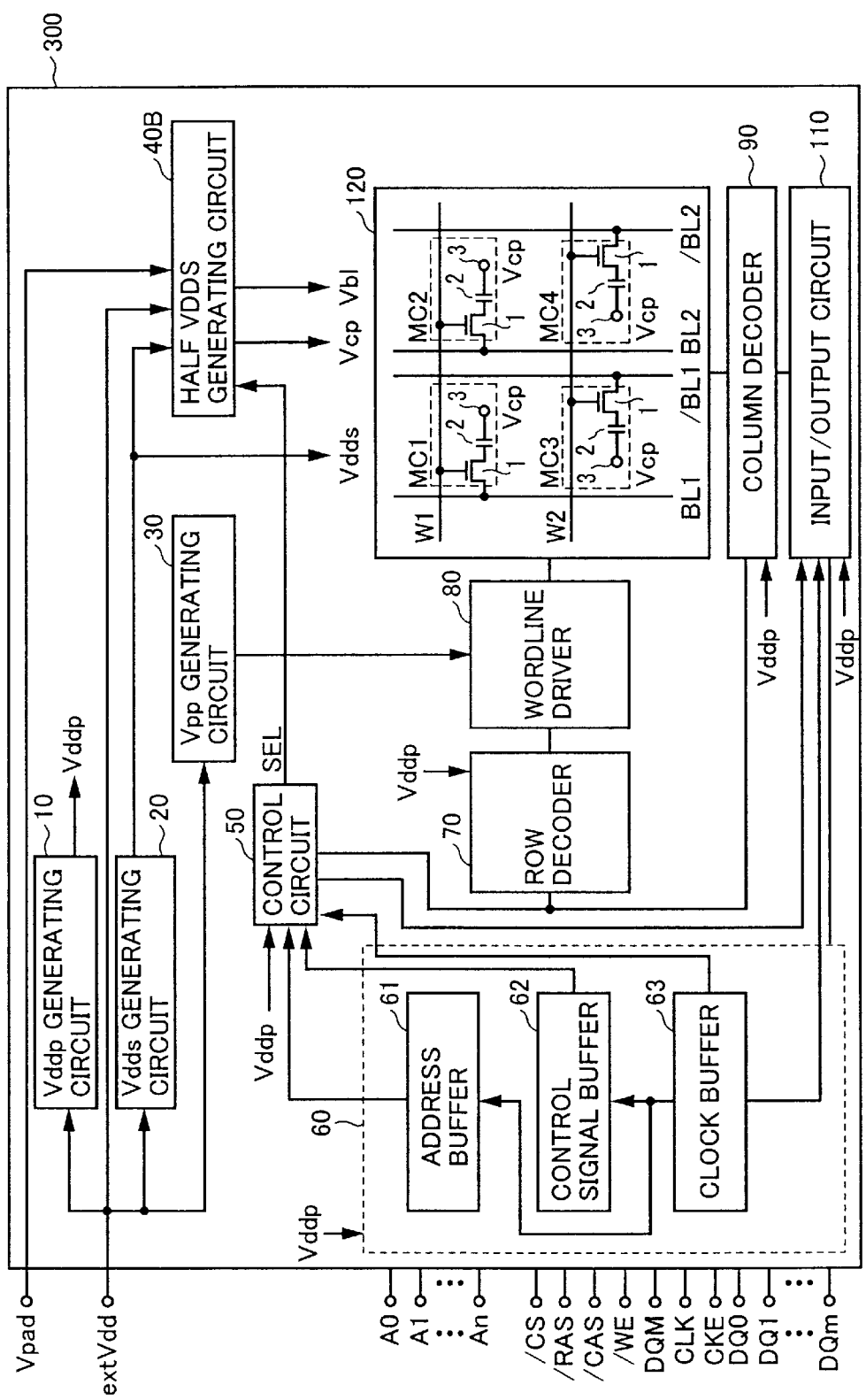
FIG. 5 is a schematic block diagram showing the configuration of a semiconductor memory device according to a second embodiment of the invention.

Referring to FIG. 5, a semiconductor memory device 300 according to a second embodiment will be described. The semiconductor memory device 300 is similar to the semiconductor memory device 100 shown in FIG. 1 except that the half Vdds generating circuit 40 is replaced with a half Vdds generating circuit 40B.

The half Vdds generating circuit 40B generates the precharge voltage Vbl and the cell plate voltage Vcp by a method described hereinlater on the basis of the external source voltage extVdd supplied from a power source terminal, the voltage Vpad supplied from an external terminal, and the array operation voltage Vdds supplied from the Vdds generating circuit 20, and supplies the generated precharge voltage Vbl and the cell plate voltage Vcp to the memory array 120.

Figure 6:
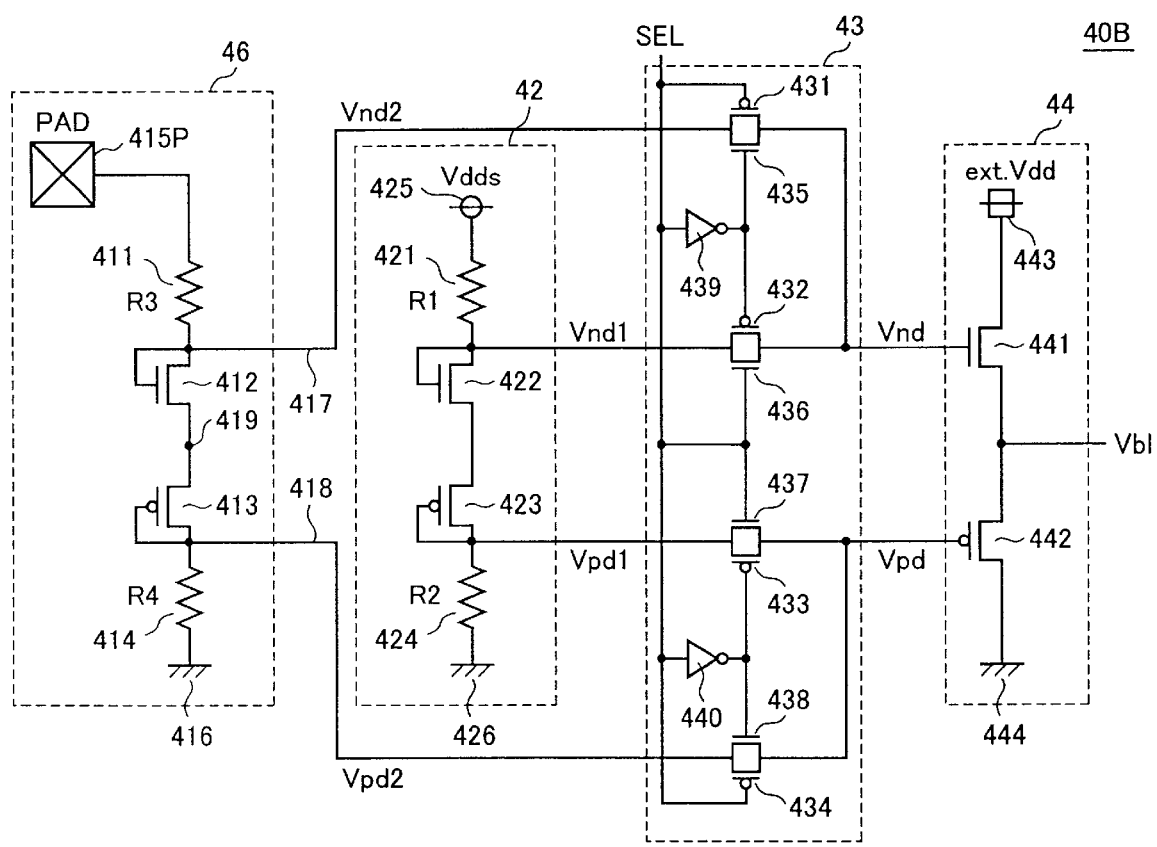
FIG. 6 is a circuit diagram of a half Vdds generating circuit in the semiconductor memory device shown in FIG. 5.

Referring to FIG. 6, the half Vdds generating circuit 40B is similar to the half Vdds generating circuit 40 shown in FIG. 2 except that the reference voltage generating circuit 41 in the half Vdds generating circuit 40 is replaced by a reference voltage generating circuit 46. The reference voltage generating circuit 46 is similar to the reference voltage generating circuit 41 shown in FIG. 2 except that the power source node 415 is replaced by a pad 415P. Specifically, a voltage Vpad having an arbitrary voltage level supplied from an external terminal is supplied to the reference voltage generating circuit 46. The reference voltage generating circuit 46 generates the voltages Vnd2 and Vpd2 obtained by dividing the voltage Vpad supplied from the pad 415P and supplies the generated voltages Vnd2 and Vpd2 to the nodes 417 and 418, respectively. When the voltages Vnd2 and Vpd2 are supplied from the reference voltage generating circuit 46 to the driver circuit 44, the following is satisfied.

$$Vb1=|Vthp1+(Vpad=Vthn1-|Vtph|)\times R4/(R3+R4) \quad (5)$$

Thus, by changing the setting of the voltage level of the voltage Vpad, the voltage level of the precharge voltage Vbl can be controlled to an arbitrary voltage level.

In the normal mode, the half Vdds generating circuit 40B supplies the precharge voltage Vbl to the memory array 120 by supplying the voltages Vnd1 and Vpd1 obtained by dividing the array operation voltage Vdds from the reference voltage generating circuit 42 to the driver circuit 44. In the test mode, the half Vdds generating circuit 40B supplies the precharge voltage Vbl to the memory array 120 by supplying the voltages Vnd2 and Vpd2 obtained by dividing the voltage Vpad supplied from the pad 415P from the reference voltage generating circuit 46 to the driver circuit 44. In both the normal mode and the test mode, therefore, the same Vbl interconnection is used to supply the precharge voltage Vbl to the memory array where the precharge voltage Vbl is consumed. As are result, as compared with the case where the precharge voltage Vbl is supplied from the external terminal directly to the memory array in a conventional manner, the tendency of a change in electric characteristics of the memory array with respect to a change in level of the precharge voltage Vbl can be accurately known, and a test condition of the precharge voltage Vbl in the test operation can be set in keeping with that in the normal mode.

The cell plate voltage Vcp is also generated in a manner similar to the precharge voltage Vbl and supplied to a cell plate of the capacitor 2 in each of the memory cells MC1 to MC4.

The operation of writing/reading data to/from the memory cells MC1 to MC4 in the semiconductor memory device 300 is the same as that in the first embodiment.

Figure 7:
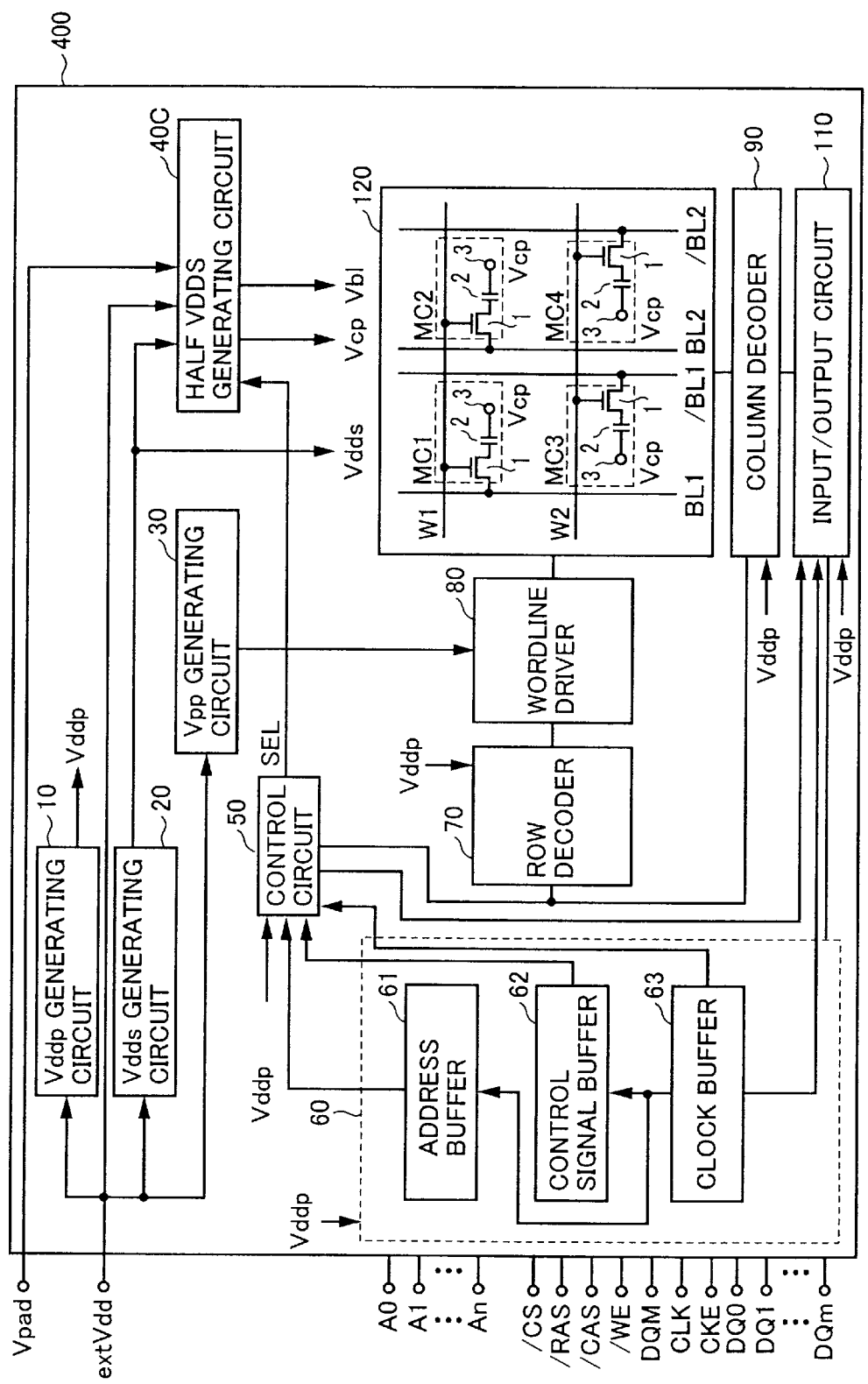
FIG. 7 is a schematic block diagram showing another configuration of the semiconductor memory device in the second embodiment.

The semiconductor memory device according to the second embodiment is not limited to the semiconductor memory device 300 but may be a semiconductor memory device 400 shown in FIG. 7. The semiconductor memory device 400 is similar to the semiconductor memory device 300 except that the half Vdds generating circuit 40B is replaced by a half Vdds generating circuit 40C.

The half Vdds generating circuit 40C generates the precharge voltage Vbl and the cell plate voltage Vcp on the basis of the external source voltage extVdd supplied from a power source terminal, the voltage Vpad supplied from an external terminal, and the array operation voltage Vdds supplied from the Vdds generating circuit 20, and supplies the generated precharge voltage Vbl and cell plate voltage Vcp to the memory array 120.

Figure 8:
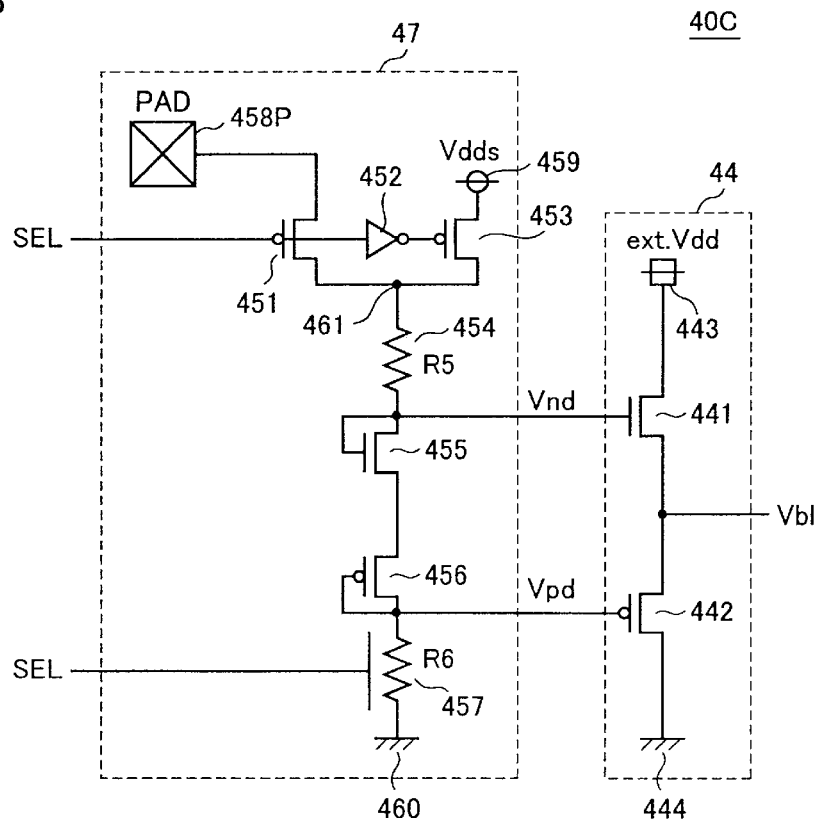
FIG. 8 is a circuit diagram of the half Vdds generating circuit of the semiconductor memory device shown in FIG. 7.

Referring to FIG. 8, the half Vdds generating circuit 40C is similar to the half Vdds generating circuit 40A shown in FIG. 4 except that the reference voltage generating circuit 45 in the half Vdds generating circuit is replaced by a reference voltage generating circuit 47. The reference voltage generating circuit 47 is similar to the reference voltage generating circuit 45 except that the power source node 458 is replaced by a pad 458P.

In the normal mode, since the array operation voltage Vdds is supplied to the node 461 by the selection signal SEL from the control circuit 50, the half Vdds generating circuit 40C supplies the precharge voltage Vbl and the cell plate voltage Vcp obtained by using the array operation voltage Vdds as a reference to the memory array 120. In the test mode, since the voltage Vpad supplied from the pad 458P is supplied by the selection signal SEL from the control circuit 50 to the node 461, the half Vdds generating circuit 40C supplies the precharge voltage Vbl and the cell plate voltage Vcp obtained by using the voltage Vpad as a reference to the memory array 120.

As described above, the half Vdds generating circuit 40C can arbitrarily control the voltage level of each of the precharge voltage Vbl and the cell plate voltage Vcp to be supplied to the memory array 120 in the test mode.

The operation of writing/reading data to/from the memory cells MC1 to MC4 in the semiconductor memory device 400 is the same as that in the first embodiment.

In the above description, each of the half Vdds generating circuits 40B and 40C generates the precharge voltage Vbl and the cell plate voltage Vcp by using the array operation voltage Vdds or the voltage Vddp as a reference. The invention is not limited to the above. Each of the half Vdds generating circuits 40B and 40C may generate either the precharge voltage Vbl or the cell plate voltage Vcp by using the array operation voltage Vdds or the voltage Vddp as a reference.

Although each of the pads 415P and 458P in the half Vdds generating circuits 40B and 40C may be a dedicated pad, desirably, each of the pads 415P and 458P also serves as a pad which usually receives another signal from the viewpoint of reduction in chip area. For example, when each of the semiconductor memory devices 300 and 400 is an SDRAM (Synchronous Dynamic Random Access Memory), each of the pads 415P and 458P also serves as a pad for receiving the data mask signal DQM. Since the data mask signal DQM is hardly used in the test mode, a reference voltage used when the half Vdds generating circuits 40B and 40C generate the precharge voltage Vbl and the cell plate voltage Vcp may be inputted via the pad for receiving the data mask signal DQM.

In the present invention, each of the pads 415P and 458P receives in the normal mode a signal different in purpose from that of a signal received by each pad in the test mode.

According to the second embodiment, the semiconductor memory device has therein the half Vdds generating circuit for supplying the precharge voltage and the cell plate voltage obtained by using the array operation voltage as a reference to the memory array in the normal mode, and supplying the precharge voltage and the cell plate voltage obtained by using the voltage having an arbitrary voltage level inputted from the outside to the memory array. Consequently, even when a normal operation test is conducted after fluctuating the array operation voltage for a predetermined period to conduct a margin test of the array operation voltage, the operation of writing/reading data to/from a memory cell can be performed with accuracy. In the test mode, various operation tests can be conducted by setting the precharge voltage or the cell plate voltage to an arbitrary voltage level.

In the foregoing first and second embodiments, the precharge voltage and the cell plate voltage to be supplied to the memory array by using the array operation voltage generated by decreasing the external source voltage have been described. The invention is not limited to the above, but can be also applied to a case where a voltage to be supplied to a voltage generating circuit which generates another internal power source voltage by using, as a reference, an internal source voltage such as an array operation voltage generated based on an external source voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which data is inputted/outputted to/from a plurality of memory cells included in a memory array, comprising:
   an external source terminal to which an external source voltage is inputted;
   a first voltage generating circuit for generating an internal source voltage on the basis of said external source voltage; and
   a second voltage generating circuit for generating an intermediate voltage as a voltage which is between said internal source voltage or prescribed voltage and a ground voltage and is necessary for inputting/outputting data to/from said plurality of memory cells, wherein said second voltage generating circuit generates said intermediate voltage in response to a voltage level of said internal source voltage in a normal mode, and generates said intermediate voltage in response to a voltage level of said prescribed voltage in a test mode.

2. The semiconductor memory device according to claim 1, wherein said second voltage generating circuit includes:
   a reference voltage generating circuit for generating a first reference voltage in response to a voltage level of said internal source voltage in said normal mode and generating a second reference voltage in response to a voltage level of said prescribed voltage in said test mode; and
   a driver circuit for outputting said intermediate voltage by supplying a current in response to a voltage level of said first or second reference voltage from a power source node.

3. The semiconductor memory device according to claim 2, further comprising a control circuit for generating a logic signal having a first logic level in said normal mode, and having a second logic level different from said first logic level in said test mode,
   wherein said reference voltage generating circuit generates said first reference voltage in accordance with said first logic level of said logic signal and generating said second reference voltage in accordance with said second logic level of said logic signal.

4. The semiconductor memory device according to claim 3, wherein said reference voltage generating circuit includes:
   a first node;
   a second node;
   a first voltage dividing circuit for dividing said internal source voltage to generate a first voltage and a second voltage;
   a second voltage dividing circuit for dividing said prescribed voltage to generate a third voltage and a fourth voltage; and
   a selecting circuit for outputting said first and second voltages as said first reference voltage to said first and second nodes, respectively, in response to said first logic level of said logic signal and outputting said third and fourth voltages as said second reference voltage to said first and second nodes, respectively, in response to said second logic level of said logic signal, and
   said driver circuit includes:
   an output node;
   a first current supplying circuit for supplying a current from said power source node to said output node in response to a voltage level on said first node; and
   a second current supplying circuit for supplying a current from said output node to a ground node in response to a voltage level on said second node.

5. The semiconductor memory device according to claim 4, wherein said first voltage dividing circuit comprises:
   a third node corresponding to said first node;
   a fourth node corresponding to said second node;
   a first resistor connected between a power source node to which said internal source voltage is supplied and said third node;
   first and second MOS transistors of different conduction types diode-connected in series between said third and fourth nodes; and
   a second resistor connected between said fourth node and said ground node,
   said second voltage dividing circuit comprises:
   a fifth node corresponding to said first node;
   a sixth node corresponding to said second node;
   a third resistor connected between the power source node to which said internal source voltage is supplied and said fifth node;
   third and fourth MOS transistors of different conduction types diode-connected in series between said fifth and sixth nodes; and
   a fourth resistor connected between said sixth node and said ground node,
   said first current supplying circuit includes a fifth MOS transistor of a first conduction type for receiving a voltage on said first node by a gate terminal, and
   said second current supplying circuit includes a sixth MOS transistor of a second conduction type for receiving a voltage on said second node by a gate terminal.

6. The semiconductor memory device according to claim 2, further comprising a control circuit for generating a logic signal having a first logic level in said normal mode, and having a second logic level different from said first logic level in said test mode,
   wherein said reference voltage generating circuit receives said internal source voltage supplied and generates said first reference voltage in accordance with said first logic level of said logic signal, and receives said prescribed voltage supplied and generates said second prescribed voltage in accordance with said second logic level of said logic signal.

7. The semiconductor memory device according to claim 6, wherein said reference voltage generating circuit includes:
   a voltage supplying circuit for supplying said internal source voltage in response to said first logic level of said logic signal and supplying said prescribed voltage in response to said second logic level of said logic signal; and
   a voltage dividing circuit for dividing said internal source voltage received from said voltage supplying circuit to generate said first reference voltage and dividing said prescribed voltage received from said voltage supplying circuit to generate said second reference voltage.

8. The semiconductor memory device according to claim 7, wherein said voltage supplying circuit comprises:
   a first power source node to which said internal source voltage is supplied;
   a second power source node to which said prescribed voltage is supplied;
   a supply node for supplying said internal source voltage or said prescribed voltage;
   a first device for receiving said logic signal with the first logic level and supplying said internal source voltage supplied to said first power source node to said supply node; and a second device for receiving said logic signal with the second logic level and supplying said prescribed voltage supplied to said second power source node to said supply node, said voltage dividing circuit comprises:
   a first node;
   a second node; and
   a voltage dividing device for, when said logic signal with the first logic level is received, dividing said internal source voltage to generate first and second voltages, and outputting the generated first and second voltages to said first and second nodes, respectively, when said logic signal with the second logic level is received, dividing said prescribed voltage to generate third and fourth voltages, and outputting the generated third and fourth voltages to said first and second nodes, respectively, and said driver circuit comprises:
   output node;
   a first current supplying device for supplying a current from said power source node to said output node in response to a voltage level on said first node; and
   a second current supplying device for supplying a current from said output node to a ground node in response to a voltage level on said second node.

9. The semiconductor memory device according to claim 1, further comprising a third voltage generating circuit for generating another internal source voltage on the basis of said external source voltage and supplying the generated another internal source voltage as said prescribed voltage to said second voltage generating circuit.

10. The semiconductor memory device according to claim 1, wherein said second voltage generating circuit supplies said intermediate voltage to one of electrodes of a capacitor included in each of said plurality of memory cells.

11. The semiconductor memory device according to claim 1, wherein said second voltage generating circuit supplies said intermediate voltage as a bit line pair precharging voltage for precharging a pair of bit lines provided in correspondence with said plurality of memory cells to said memory array.

12. The semiconductor memory device according to claim 1, further comprising a prescribed voltage terminal to which said prescribed voltage is supplied.

13. The semiconductor memory device according to claim 12, wherein said prescribed voltage terminal receives in said normal mode a signal different in purpose from that of a signal received by said prescribed voltage terminal in said test mode.

\* \* \* \* \*